US006589364B1

(12) United States Patent
Essaian et al.

(10) Patent No.: US 6,589,364 B1
(45) Date of Patent: Jul. 8, 2003

(54) FORMATION OF DOPED SILICON-GERMANIUM ALLOY UTILIZING LASER CRYSTALLIZATION

(75) Inventors: Stepan Essaian, San Jose, CA (US); Abdalla A. Naem, Overijse (BE)

(73) Assignee: National Semiconductor Corporation, Santa Clara ( * ) Notice: Subject to any disclaimer, the term of this patent is extended or adjusted under 35 U.S.C. 154(b) by 80 days.

(21) Appl. No.: 09/620,635

(22) Filed: Jul. 20, 2000

(51) Int. Cl.$^7$ .................. H01L 21/20; H01L 21/268
(52) U.S. Cl. ................... 148/239; 148/525
(58) Field of Search .................. 148/239, 525

(56) References Cited

U.S. PATENT DOCUMENTS

| | | | | |
|---|---|---|---|---|
| 4,392,297 A | * | 7/1983 | Little ................... | 29/572 |
| 4,415,383 A | | 11/1983 | Naem et al. ................ | 148/187 |
| 4,849,371 A | * | 7/1989 | Hansen et al. .............. | 437/82 |
| 5,114,876 A | * | 5/1992 | Weiner ..................... | 437/89 |
| 5,225,371 A | * | 7/1993 | Sexton et al. ............. | 437/173 |
| 5,889,292 A | * | 3/1999 | Sameshima et al. ......... | 257/65 |

OTHER PUBLICATIONS

Erin C. Jones et al., "Modeling of Leakage Mechanisms in Sub–50 nm p+–n Junctions", J. Vac. Sci. Technol. B14(1), Jan./Feb. '96, pp. 236–241.

Katsuyoshi Washio, "SiGe HBTs and ICs for Optical–Fiber Communication Systems", Solid–State Electronics 43(1999) pp. 1619–1625.

K.–Josef Kramer et al., "Resistless, Area–Selective Ultrashallow P+ IN Junction Fabrication Using Projection Gas Immersion Laser Doping", Appl. Phys. Lett. 68(17), Apr. 22, 1996, pp. 2320–2322.

* cited by examiner

Primary Examiner—George Wyszomierski
(74) Attorney, Agent, or Firm—Stallman & Pollock LLP

(57) ABSTRACT

A silicon-germanium alloy of high crystal quality and containing uniform concentrations of dopant and germanium is formed by applying laser energy to a doped amorphous/polysilicon germanium layer overlying epitaxial silicon. Energy transferred from the laser beam causes melting of the germanium and the underlying silicon, resulting in diffusion of germanium and dopant into the melted silicon. Subsequent cooling and crystallization of the silicon/germanium/dopant melt produces a high quality crystal lattice uniformly incorporating germanium and dopant within its structure. Efficient energy transfer from the laser beam to the underlying germanium and silicon may be promoted by patterning an anti-reflective coating over the amorphous/polysilicon doped germanium prior to exposure to laser radiation. The process is particularly suited for forming the silicon-germanium base of a heterojunction bipolar transistor device.

14 Claims, 3 Drawing Sheets

FORMATION OF DOPED SILICON-GERMANIUM ALLOY UTILIZING LASER CRYSTALLIZATION

BACKGROUND OF THE INVENTION

1. Field of the Invention

The present invention relates to formation of silicon-germanium alloys and, in particular, to the formation of silicon-germanium alloys utilizing energy from an applied laser.

2. Description of the Related Art

Silicon-germanium alloys are finding increased use in semiconductor manufacturing due to the emergence of band gap engineering to control conductance. Silicon-germanium alloys are particularly useful for forming the base material of high speed heterojunction bipolar transistor (HBT) devices.

FIGS. 1A–1F show a conventional process flow for forming an HBT.

FIG. 1A shows the starting point for the process, wherein single crystal silicon workpiece 100 containing dopant of a first conductivity type is exposed to an ambient containing a mixture of silane ($SiH_4$) 102 and germine ($GeH_4$) 104 gases. FIG. 1B shows the resulting deposition of silicon-germanium alloy 106 over the surface of single crystal silicon workpiece 100. FIG. 1C shows the ion-implantation of dopant 108 of a second conductivity type opposite the first conductivity type into silicon-germanium alloy 106. FIG. 1D shows the subsequent formation of polysilicon layer 110 over the doped silicon-germanium alloy 106. Polysilicon layer 110 is then highly doped by ion-implantation of dopant 112 of the first conductivity type, as shown by FIG. 1E. FIG. 1F shows completion of fabrication of HBT structure 114, wherein polysilicon layer 110 and silicon-germanium alloy layer 106 are selectively removed to reveal polysilicon emitter 116 overlying and separated from single crystal silicon collector 118 by silicon-germanium base 120.

While the above FIGS. 1C and 1E depict introduction of conductivity-altering dopant by ion-implantation, it is also well known in the art to introduce dopant by chemical vapor deposition followed by thermal drive-in.

While satisfactory for some applications, the conventional process for forming the HBT suffers from a number of disadvantages. In particular, formation of the silicon-germanium alloy of the base by co-deposition of silicon and germanium-containing gases, as shown in FIGS. 1A–1B, produces an alloy having uneven concentrations of silicon and germanium. In addition, the conventional co-deposition technique produces a silicon-germanium alloy of relatively low crystal quality. Both the uneven Si—Ge concentration and the poor crystal structure of the conventionally-formed alloy degrade the operational characteristics of the HBT.

Therefore, there is a need in the art for a process for forming a high quality silicon-germanium alloy having uniform silicon and germanium concentrations.

SUMMARY OF THE INVENTION

The present invention relates to a process for forming a high quality crystalline doped silicon-germanium alloy utilizing, laser annealing. An amorphous or polycrystalline doped germanium film is first formed over epitaxial silicon. Application of radiation from a laser beam to the amorphous/polycrystalline doped germanium layer melts both the germanium layer and a portion of the underlying epitaxial silicon. The high temperature of melting promotes diffusion of both germanium and dopant into the underlying silicon. Removal of the laser beam causes the silicon-germanium-dopant melt to cool and recrystallize in high quality crystalline form. Diffusion of germanium and dopant during the melting step ensures uniform incorporation of these materials into the silicon-germanium lattice.

A first embodiment of a process for forming a silicon-germanium alloy in accordance with the present invention comprises the steps of forming a doped amorphous/polycrystalline germanium layer over a single crystal silicon workpiece. A laser beam is applied to melt the doped polycrystalline/amorphous germanium layer and single crystal silicon and cause dopant from the doped germanium layer to diffuse into the silicon. Removing the laser beam causes melted germanium and silicon to solidify to form a silicon-germanium alloy incorporating dopant from the amorphous/polycrystalline germanium layer.

The features and advantages of the present invention will be understood upon consideration of the following detailed description of the invention and the accompanying drawings.

DETAILED DESCRIPTION

The present invention relates to a process for forming a high-quality silicon-germanium alloy utilizing laser crystallization of an amorphous or polycrystalline doped germanium film. Specifically, amorphous or polycrystalline doped germanium is deposited over single crystal silicon. This doped amorphous or polycrystalline doped Ge layer is then exposed to pulsed UV radiation from an excimer laser. Due to high absorption of U.V. radiation by Ge. Heat transferred from the excimer laser beam to the underlying material melts the amorphous Ge film and an underlying epitaxial silicon layer, causing germanium and dopant to diffuse into the single crystal silicon. Following removal of the laser radiation, a doped, high quality crystalline $Ge_xSi_{1-x}$ alloy crystallizes in thermally stable form.

U.S. Pat. No. 4,415,383 to Naem et al. ("the Naem Patent"), entitled "Method of Fabricating Semiconductor Devices Using Laser Annealing", is hereby incorporated by reference. The Naem Patent describes the melting of polysilicon by the application of radiation from a laser beam, followed by recrystallization of the melted silicon to form thermally stable, ordered crystalline silicon. Melting and recrystallization of the polysilicon is promoted by forming an anti-reflective coating (ARC) over the polysilicon prior to exposure to laser radiation. The ARC suppresses reflection of the incident laser radiation by the polysilicon, thereby promoting efficient transfer of energy from the laser beam to the polysilicon. This efficient energy transfer results in the ARC-coated polysilicon being heated to higher temperatures than would otherwise result from application of the laser energy.

Figure 1A:
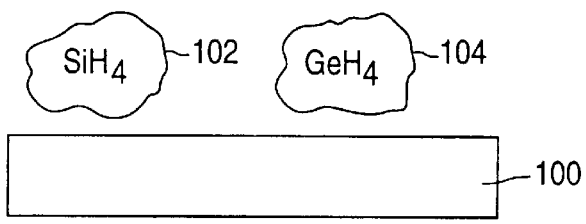
FIGS. 1A–1F are cross-sectional views illustrating the conventional process flow for forming an HBT structure.
Figure 1B:
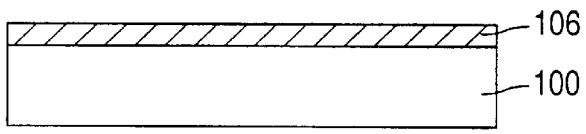
Figure 1C:
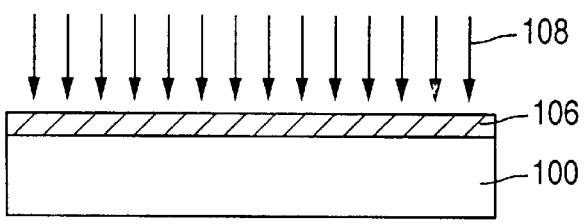
Figure 1D:
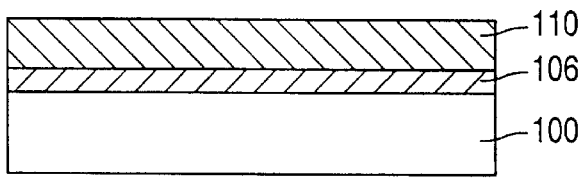
Figure 1E:
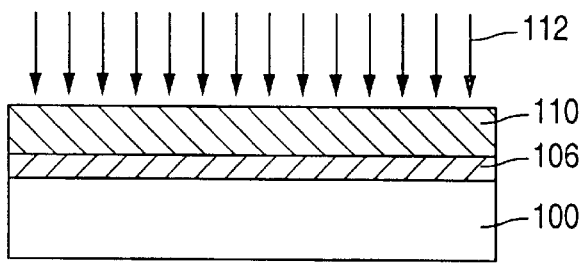
Figure 1F:
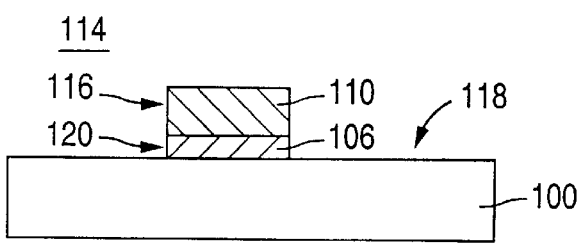
Figure 2A:
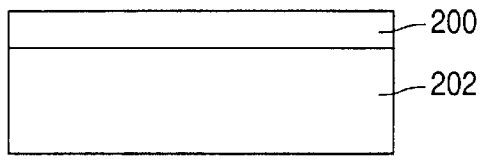
FIGS. 2A–2F are cross-sectional views illustrating a first embodiment of a process flow in accordance with the present invention for forming a doped silicon-germanium alloy.

FIGS. 2A–2F show cross-sectional views of a first embodiment of a process flow for forming a Si—Ge alloy in accordance with the present invention. FIG. 2A shows formation of epitaxial silicon layer 200 over single-crystal silicon workpiece 202.

Figure 2B:
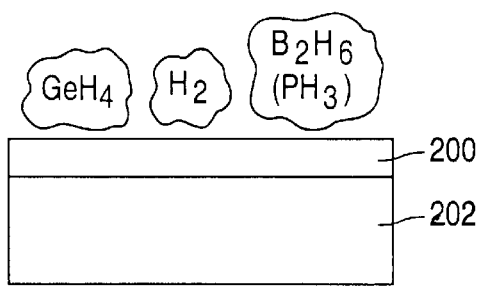
Figure 2C:
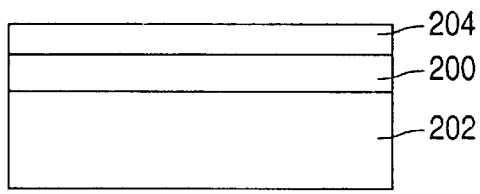

FIG. 2B shows the next step, wherein epitaxial silicon 200 is exposed to an ambient containing a mixture of $GeH_4$, $H_2$, and $B_2H_6(PH_3)$ gases at atmospheric or reduced pressure. FIG. 2C shows that as a result of these conditions, doped amorphous or polycrystalline germanium layer 204 is formed over epitaxial silicon layer 200.

Figure 2D:
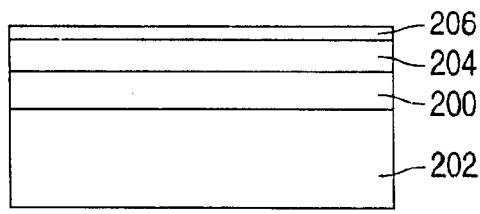

FIG. 2D shows formation of ARC 206 over doped amorphous/polycrystalline germanium layer 204. ARC 206 may be composed of a variety of materials, including silicon nitride, silicon oxynitride, titanium nitride, or an organic polymer.

Figure 2E:
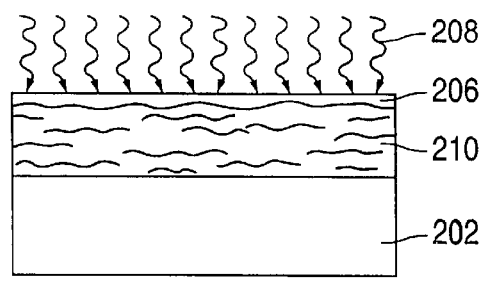

FIG. 2E shows exposure to laser radiation 208. Laser radiation 208 is typically produced by an excimer laser having a wavelength in the deep-ultraviolet region of the spectrum. Examples of such excimer lasers include XeCl lasers having an output wavelength of 308 nm, KrF lasers having an output wavelength of 248 nm, and ArF lasers having an output wavelength of 198 nm. Exposure to radiation having such short wavelengths is important to ensure heating and melting of only shallow portions of the doped amorphous/polycrystalline germanium and underlying silicon materials. The energy of the applied beam is typically between about 0:5–1.0 $J/cm^2$.

As a result of exposure to laser radiation 208, the doped amorphous/polycrystalline germanium layer and the underlying epitaxial silicon layer are heated to high temperatures (over approximately 1400° C.) and converted into melt 210. During this step, germanium and boron from the melted doped amorphous/polycrystalline germanium layer diffuse into the underlying silicon. Efficient transfer of energy from the laser radiation to the underlying material is promoted by the presence of ARC 206, which suppresses reflection of the incident laser beam.

Figure 2F:
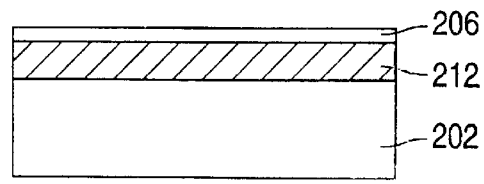

FIG. 2F shows that cessation of exposure to the excimer laser radiation causes Si/Ge/dopant melt 210 to crystallize into doped, thermally stable, and ordered crystalline silicon-germanium alloy 212.

Simulation and microscopy evidence the success of the illustrated process.

Figure 3:
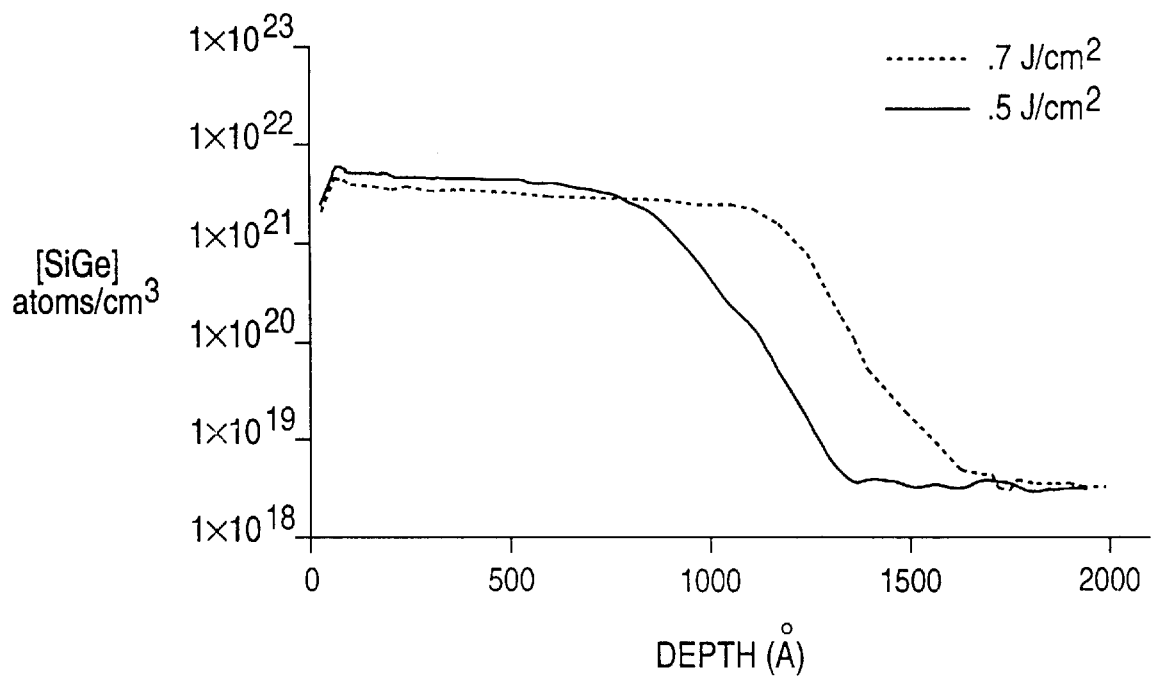
FIG. 3 plots simulated Si and Ge elemental concentration versus depth for doped Si—Ge alloy layer formed by the process shown in FIGS. 2A–2F.

FIG. 3 plots shows results of SIMS data of Si and Ge elemental concentration versus depth for a 100 Å (Ge:B)/600 Å (Si) stack exposed to an XeCl excimer laser of wavelength 308 nm. and 30 ns pulse of power of either 0.5 $J/cm^2$ or 0.7 $J/cm^2$. FIG. 3 shows that at higher energies of laser irradiation, the Si—Ge alloy is created at a greater depth into the underlying silicon material. As a result of recrystallization following this exposure to laser radiation, a 680 Å $Si_{0.9} Ge_{0.1}$ alloy layer is fabricated with the Ge box profile.

Figure 4:
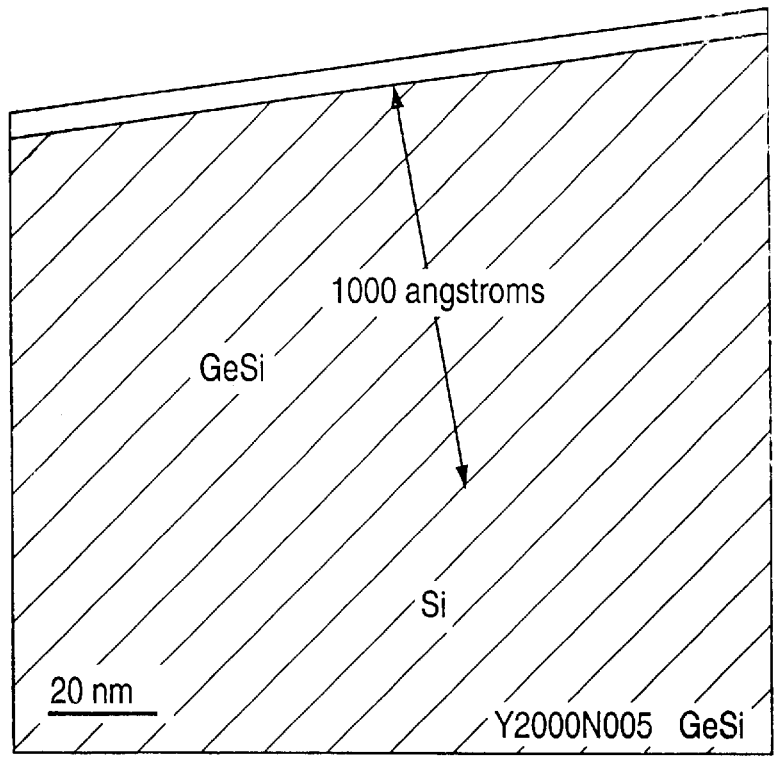
FIG. 4 is a copy of an HRTEM photograph showing an alloy layer formed by the process of FIGS. 2A–2F.

FIG. 4 shows an HRTEM photograph of a SiGe alloy layer formed by the present process. HRTEM shows that SiGe layer has good crystallinity to a depth of about 1000 Å and a smooth interface with the underlying Si substrate.

The process for forming a doped, high quality silicon-germanium alloy in accordance with the present invention offers a number of important advantages over conventional processes.

One important advantage of the present invention is the formation of a high quality crystalline alloy having uniform and stable distribution of dopant and germanium. This uniform distribution of dopant and germanium occurs because high temperatures generated by absorption of laser radiation by the ARC results in homogenous distribution of germanium and dopant within the melt. Upon crystallization, this germanium and dopant is evenly incorporated within the alloy crystal lattice of the alloy.

Another important advantage is low sensitivity to process variation. Specifically, the process in accordance with the present invention exhibits a wide tolerance window. A silicon-germanium alloy layer of thickness 300–2000 Å having a Ge content of between 5–30% and a boron concentration of $10^{17}$–$10^{18}$ atoms/$cm^3$ can be obtained by melting 50–150 Å of boron-doped amorphous or polycrystalline germanium deposited over 250–1500 Å of epitaxial silicon.

Still another important advantage of the process in accordance with the present invention is flexibility. By varying such process parameters as the thickness and composition of the ARC, the thickness and dopant concentration of the deposited amorphous Ge film, and/or by varying the parameters of the applied laser energy (e.g., pulse energy, duration, and/or repetition rate), $Ge_xSi_{1-x}$ alloys of varying thicknesses, germanium concentrations, and dopant concentrations can be produced.

Yet another advantage of the process in accordance with the present invention is the ability to introduce dopant into semiconductor material with a high degree of selectivity. By carefully patterning the ARC layer, generation of high temperatures and hence the location of melting and dopant diffusion, can be precisely controlled.

Although the present invention has so far been described in connection with one specific embodiment, the invention should not be limited to this particular embodiment. Various modifications and alterations in the structure and process will be apparent to those skilled in the art without departing from the scope of the present invention.

For example, while the process depicted above in FIGS. 2A–2F shows patterning of an ARC layer to enhance energy transferred by the laser beam, this is not required by the present invention. A doped amorphous/germanium film and underlying epitaxial silicon could be melted by a laser without the assistance of an overlying ARC, and the process would still remain within the scope of the present invention.

In addition, while the process depicted above shows the introduction of dopant in-situ into the amorphous/polycrystalline germanium layer, this is also not required by the present invention. Dopant could be introduced into the amorphous/polycrystalline layer by ion implantation or other means prior to the laser recrystallization step.

Finally, while boron is shown as being introduced into the amorphous/polycrystalline germanium layer in the process of FIGS. 2A–2F, the process in accordance with the present invention is not limited to the introduction of this type of conductivity-altering dopant. Other dopant species, such as phosphorous, arsenic, or antimony, could be introduced into the crystal lattice by laser melting and diffusion as described above.

Given the above detailed description of the invention and the variety of embodiments described therein, it is intended that the following claims define the scope of the present invention, and that the structures and processes within the scope of these claims and their equivalents be covered hereby.

What is claimed is:

1. A method of forming a doped silicon-germanium alloy, the method comprising:

providing an epitaxial silicon layer over a single crystal silicon substrate;

forming a layer of doped noncrystalline germanium on an upper surface of the epitaxial silicon layer;

applying a laser beam to melt both the doped noncrystalline germanium layer and at least an upper surface portion of epitaxial silicon layer and to cause dopant from the doped noncrystalline germanium layer to diffuse into the melted portion of the epitaxial silicon layer; and removing the laser beam to cause the melted germanium and the melted epitaxial silicon to solidify to form a crystalline silicon-germanium alloy layer incorporating dopant from the germanium layer.

2. The method of claim 1, and wherein the step of forming a doped noncrystalline germanium layer comprises exposing the epitaxial silicon layer to a gaseous ambient containing dopant.

3. The method of claim 1, and wherein the step of forming a doped noncrystalline germanium layer comprises exposing the epitaxial silicon layer to an ambient gas mixture that includes $GeH_4$, $H_2$ and $B_2H_6(PH_3)$.

4. The method of claim 1, and wherein the step of forming a doped noncrystalline germanium layer comprises:

exposing the epitaxial silicon layer to a gaseous ambient containing germanium to form a layer of undoped noncrystalline germanium; and introducing dopant into the undoped noncrystalline germanium layer to form the doped noncrystalline germanium layer.

5. The method of claim 1, and wherein the step of applying a laser beam heats the doped noncrystalline germanium layer and the at least an upper surface portion of the epitaxial silicon layer to above approximately 1400° C.

6. The method of claim 1, and further comprising the step of forming an anti-reflective coating (ARC) over the doped noncrystallline germanium layer prior to the step of applying the laser beam.

7. The method of claim 6, and wherein the anti-reflective coating (ARC) comprises silicon nitride.

8. The method of claim 6, and wherein the anti-reflective coating (ARC) comprises silicon oxynitride.

9. The method of claim 6, and wherein the anti-reflective coating (ARC) comprises titanium nitride.

10. The method of claim 6, and wherein the anti-reflective coating (ARC) comprises an organic polymer.

11. The method of claim 6, and further comprising the step of varying at least one process parameter selected from the group consisting of anti-reflective coating (ARC) thickness, anti-reflective coating composition, concentration of dopant, laser pulse energy, laser pulse wavelength, laser pulse duration, and laser pulse repetition rate, in order to form a desired concentration of germanium and dopant in the crystalline silicon-germanium alloy.

12. The method of claim 6, and wherein the step of applying a laser beam to the anti-reflective coating (ARC) comprises applying an excimer laser beam having a wavelength selected from the group consisting of 193 nm, 248 nm, and 308 nm.

13. The method of claim 1, and wherein the step of applying a laser beam comprises applying a laser beam having an energy of between about 0.5–1.0 $J/cm^2$.

14. The method of claim 1, and wherein the noncrystalline germanium is amorphous germanium.

* * * * *